(12) United States Patent
Varnica

(10) Patent No.: US 9,009,578 B1
(45) Date of Patent: Apr. 14, 2015

(54) METHODOLOGY FOR IMPROVED BIT-FLIPPING DECODER IN 1-READ AND 2-READ SCENARIOS

(71) Applicant: Marvell International Ltd., Hamilton (BM)

(72) Inventor: Nedeljko Varnica, San Jose, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 13/673,371

(22) Filed: Nov. 9, 2012

Related U.S. Application Data

(60) Provisional application No. 61/558,768, filed on Nov. 11, 2011.

(51) Int. Cl.
*H03M 13/00* (2006.01)
*H03M 13/37* (2006.01)

(52) U.S. Cl.
CPC ..................................... *H03M 13/37* (2013.01)

(58) Field of Classification Search
CPC .................... H03M 13/1108; H03M 13/1105; G06K 19/06037; G06K 7/1443
USPC ............. 375/341; 341/58; 714/703, 800, 708, 714/785, 793
See application file for complete search history.

(56) References Cited

U.S. PATENT DOCUMENTS

| | | | |
|---|---|---|---|
| 6,457,147 B1 * | 9/2002 | Williams | 714/703 |
| 6,642,862 B2 * | 11/2003 | Boudry | 341/58 |
| 7,441,178 B2 * | 10/2008 | Xin | 714/800 |
| 8,155,247 B2 * | 4/2012 | Koorapaty et al. | 375/341 |
| 8,347,194 B2 * | 1/2013 | No et al. | 714/785 |
| 8,458,536 B2 * | 6/2013 | Yang | 714/708 |
| 2011/0246862 A1 * | 10/2011 | Graef | 714/785 |

* cited by examiner

*Primary Examiner* — David Ton

(57) ABSTRACT

Systems and methods are provided for decoding data. A decoder includes a syndrome memory, a state memory, and decoding circuitry communicatively coupled to the syndrome memory and the state memory. The decoding circuitry retrieves data related to a symbol from the syndrome memory. The decoding circuitry also retrieves data related to the symbol from the state memory. The decoding circuitry processes the data retrieved from the syndrome memory and the data retrieved from the state memory to determine whether to toggle a value of the symbol. The determination is based at least in part on whether the symbol of the data being decoded was previously toggled from an original state.

20 Claims, 10 Drawing Sheets

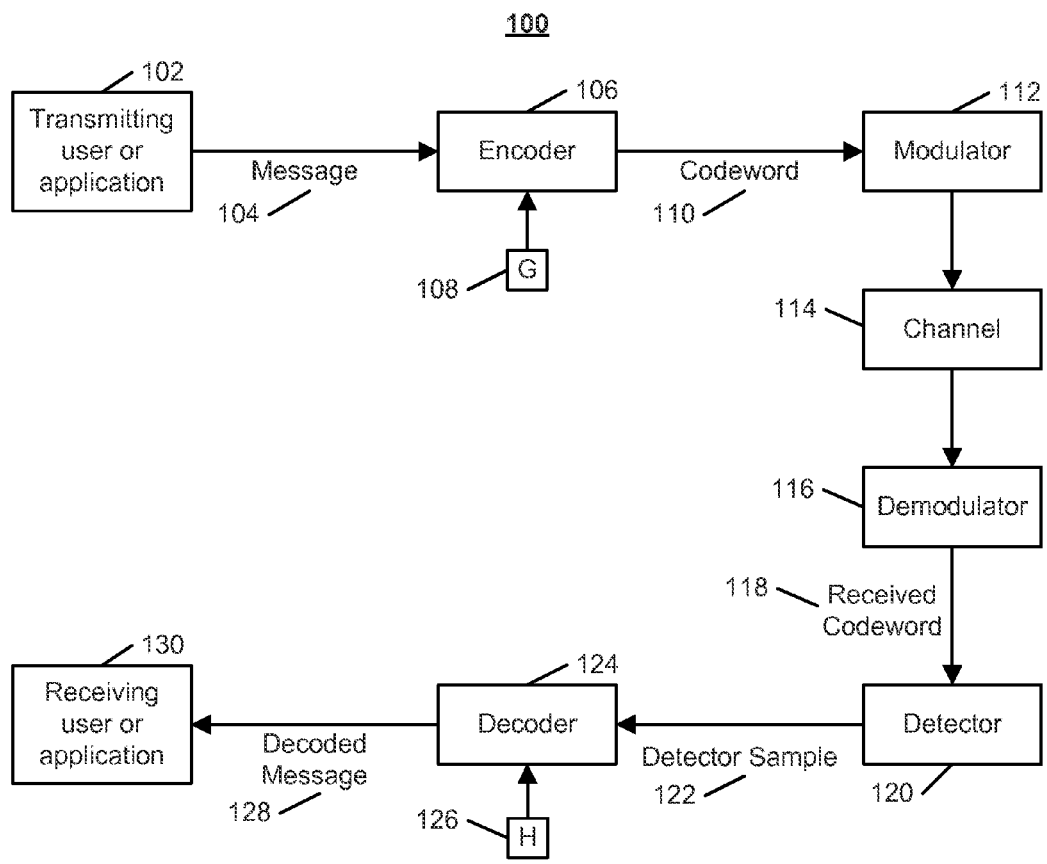
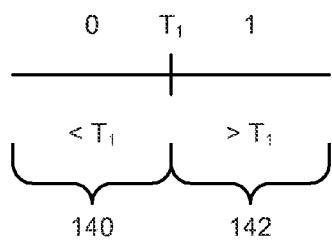
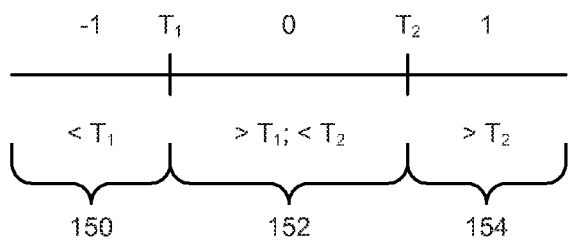
Figure 1A
Figure 1B
Figure 1C

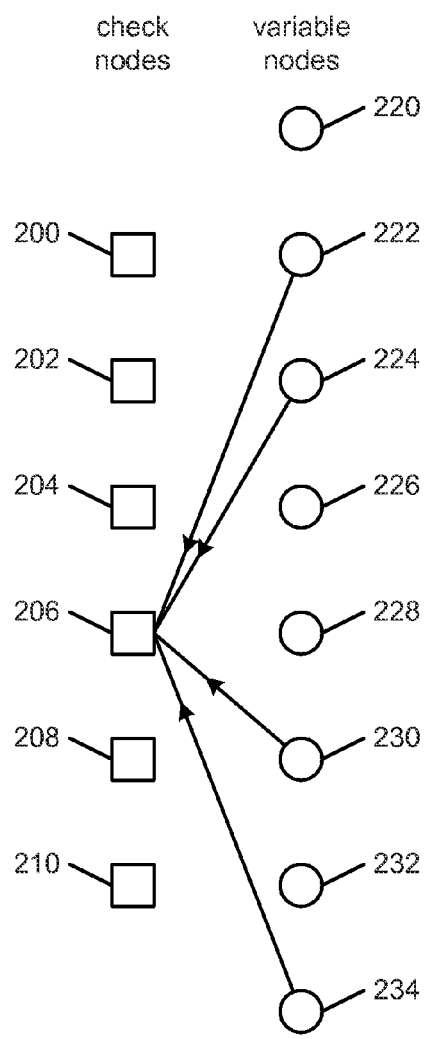
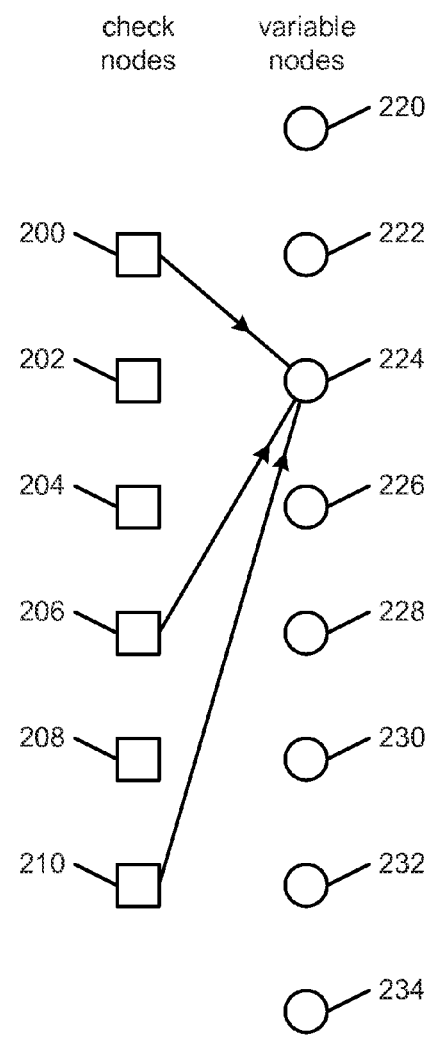
Figure 2A                    Figure 2B

METHODOLOGY FOR IMPROVED BIT-FLIPPING DECODER IN 1-READ AND 2-READ SCENARIOS

CROSS REFERENCE TO RELATED APPLICATION

This application claims the benefit under 35 U.S.C. §119(e) of U.S. Provisional Application No. 61/558,768, filed Nov. 11, 2011, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to one-read and two-read decoders for data encoded with a low density parity check (LDPC) encoder.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy communications or data storage channel. The information may be encoded (by a LDPC encoder) prior to transmission and then subsequently decoded (by a LDPC decoder) when received. The performance capability of an LDPC coding scheme is often described by the code's performance curve. The performance curve is a plot of signal-to-noise ratios (SNRs) vs. Bit Error Rate (BER), or equivalently Sector Error Rate (SER). LDPC codes are one of the best performing error correcting codes, along with Turbo codes, for use in correcting errors in information transmitted on communication and data storage channels.

Previous hard decoding LDPC algorithms typically decide whether to flip a bit or symbol based on whether a given number of checks are unsatisfied. Previous LDPC algorithms typically do not use information related to prior bit-flipping or toggling, and they typically do not use information on the original or previous state of a symbol to decide whether to flip or toggle the symbol.

SUMMARY

The present disclosure relates to a decoder for decoding data. In some arrangements, the decoder includes a syndrome memory, a state memory, and decoding circuitry communicatively coupled to the syndrome memory and the state memory. The decoding circuitry retrieves data related to a symbol from the syndrome memory. The decoding circuitry also retrieves data related to the symbol from the state memory. The decoding circuitry processes the data retrieved from the syndrome memory and the data retrieved from the state memory to determine whether to toggle a value of the symbol. The determination is based at least in part on whether the symbol of the data being decoded was previously toggled from an original state.

In some implementations, the state memory stores an indication of an original signal of the symbol, and the decoding circuitry determines whether to toggle the value of the symbol based on the original signal of the symbol. In other implementations, the state memory stores an indication of whether the symbol has been previously toggled, and the decoding circuitry determines whether to toggle the value of the symbol based on whether the symbol has been previously toggled. In other implementations, the state memory stores an indication of whether a value of a symbol has been toggled within a pre-specified number of preceding iterations, and the decoding circuitry determines whether to toggle the value of the symbol based on whether the symbol has been toggled within the pre-specified number of preceding iterations.

In some implementations, the decoding circuitry determines whether to retrieve data from the state memory based on the data retrieved from the syndrome memory, and the decoding circuitry retrieves the data from the state memory in response to determining to retrieve data from the state memory. In such implementations, the syndrome memory may include a plurality of check nodes related to the symbol. Determining whether to retrieve data from the state memory may comprise determining whether at least a number of the plurality of check nodes indicate that a check is unsatisfied. Determining whether to retrieve data from the state memory may additionally or alternatively comprise determining whether fewer than a number of the plurality of check nodes indicate that a check is unsatisfied.

According to another aspect, the present disclosure relates to a method for decoding data. The method involves receiving data related to a symbol and processing the retrieved data to determine whether to toggle a value of the symbol based at least in part on whether the symbol was previously toggled from an original state.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIG. 1A shows an illustrative communications system employing improved LDPC decoding in accordance with some arrangements;

FIG. 1B shows an illustration of processing rules for assigning hard decisions in a one-read implementation of the detector of FIG. 1A in accordance with some arrangements;

FIG. 1C shows an illustration of processing rules for assigning hard decisions and erasures in a two-read implementation of the detector of FIG. 1A in accordance with some arrangements;

FIGS. 2A and 2B show a graphical illustration of communications between variable nodes representing symbols of a received codeword and check nodes for decoding the received codeword in accordance with some arrangements;

DETAILED DESCRIPTION

Figure 3A:
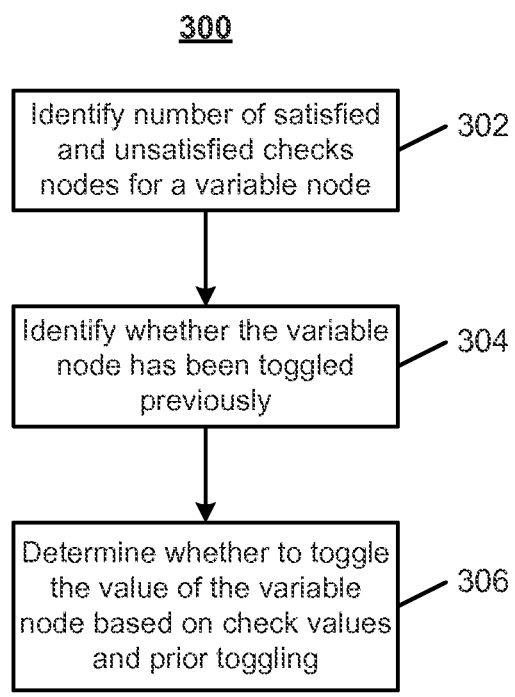
FIG. 3A shows a flow chart for a processing rule for determining whether to toggle a variable node based in part on whether the variable node was previously toggled, in accordance with some arrangements.

FIG. 1A shows an illustrative communications system for LDPC decoding based in part on whether the data was previously toggled in accordance with some arrangements. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1A). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data, ternary data, quaternary data, any other suitable type of data, or any suitable combination thereof. An encoder 106 is used to encode the message 104 to produce a codeword 110. In a preferred arrangement, the encoder 106 is an LDPC encoder. However, based on the disclosure and teachings provided herein, it should be clear that the encoder 106 may be any other suitable encoder. The codeword 110, also referred to as $\underline{c}$, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an arrangement, the encoder 106 produces the codeword 110 from the message 104 using the generator matrix G 108 by the following matrix multiplication $$\underline{c} = Gm.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes or is stored on before being recovered at a demodulator 116. For example, the channel 114 may be a storage channel that represents a storage medium in a computer system environment or a communications channel that represents the wireless propagation environment in a wireless communications environment. Various characteristics of the channel 114 may corrupt data that is communicated or stored thereon. For example, the channel 114 may be a non-ideal memoryless channel or a channel with memory. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which is an estimate of the original data message 104. The detector 120 samples each symbol in the received codeword 118 and assigns each symbol to a bin based on its value. In some arrangements, the bin is assigned based on a probability distribution. Each symbol sampled by the detector 120 is assigned to one of two or more possible bins, or states. Rules for assigning the symbols into one of two bins or states (0 and 1 states) are described in relation to FIG. 1B. Rules for assigning the symbols into one of three bins or states (−1, 0 (i.e., erasure), and 1 states) are described in relation to FIG. 1C.

A decoder 124 receives and iteratively processes the detector sample 122. The detector 120 and the decoder 124 may be two separate processors, or a single processor may be used as both the detector 120 and decoder 124. In general, the decoder 124 comprises control circuitry used to iteratively correct and/or detect errors present in the detector sample 122, for example, due to transmission through the channel 114. In some arrangements, the decoder 124 uses the parity check matrix H 126 and a decoding algorithm to produce a decoded message 128. In general, LDPC decoding can be described using a mathematical vector model $Hc = \vec{0}$, in which c is a binary string of length n and H is the parity check matrix H 126, which is a low-density, sparse n×k matrix, wherein, as above, n is the number of symbols in the codeword and k is the number of symbols in the message. The model is satisfied only when the binary string c is the codeword $\underline{c}$ 110. The parity check matrix H 126 is not necessarily unique, and may be chosen to be computationally convenient and/or to decrease the number of errors generated by the decoding algorithm of the decoder 124.

The iterative decoding algorithm used by the decoder 124 involves processing a detector sample 122 by toggling or flipping symbols in the detector sample 122 based on whether checks of the symbol are satisfied or unsatisfied and based on whether the symbol has been toggled or flipped before. As used herein, symbols are "flipped" if they can alternate between two possible values, e.g., 0 and 1. As used herein, symbols are "toggled" if they can alternate between two or more possible values, e.g., between 0 and 1 or between −1, 0 (erasure), and 1.

After processing, each symbol in the decoded message 128 should be assigned as one of two binary states. When input into the model $\vec{Hc}=\vec{0}$ as c, the decoded message 128 satisfies the model. Suitable algorithms for performing the decoding are described in relation to FIG. 2A through FIG. 6B.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

FIG. 1B shows an illustration of processing rules for assigning hard decisions at the detector of FIG. 1A in accordance with one-read arrangements. The detector 120 accesses each symbol of the received codeword 118 stored in memory in order to determine and/or store an input state of each symbol. In FIG. 1B, two input states are shown: 0 and 1. These states correspond to the two bins 140 and 142 shown in FIG. 1B. To determine to which bin the symbol should be assigned, the actual received value is compared a threshold $T_1$. These thresholds may be predetermined.

As an example, to determine the input state of a given symbol stored in a Flash memory storage device, the memory cell in which the received value of the symbol is stored is read once. In particular, the decoder 124 reads the memory cell and compares the charge stored in that cell to a first threshold $T_1$. If the stored charge is less than $T_1$, the stored charge of the symbol falls into the left region 140, and the detector 120 stores a value of 0 as the input state of that symbol. If the charge is greater than $T_1$, the stored charge of the symbol falls into the right region 142, and the detector 120 stores a value of 1 as the input state of that symbol. The input states determined for the detector sample 122 are stored in memory as variable nodes or symbols of the sampled codeword. This memory is termed the "hard decision memory", which may be in a different memory location from the memory location of the received codeword 118.

FIG. 1C shows an illustration of processing rules for assigning hard decisions and erasures at the detector of FIG. 1A in accordance with two-read arrangements. The detector 120 accesses each symbol of the received codeword 118 stored in memory in order to determine and/or store an input state of each symbol. In FIG. 1C, three input states are shown: −1, 0 (i.e., "erased"), and 1. These states correspond to the three bins 150, 152, and 154 shown in FIG. 1C. To determine to which bin the symbol should be assigned, the actual received value is compared to two thresholds $T_1$ and $T_2$. These thresholds may be predetermined.

As an example, to determine the input state of a given symbol stored in a Flash memory storage device, the memory cell in which the received value of the symbol is stored may be read once or twice. First, the decoder 124 reads the memory cell and compares the charge stored in that cell to a first threshold $T_1$. If the stored charge is less than $T_1$, the stored charge of the symbol falls into the leftmost region 150 and the detector 120 stores a value of −1 as the input state of that symbol. If the charge is greater than $T_1$, the detector 120 reads the memory cell a second time and compares the stored charge to a second threshold $T_2$. If the stored charge is greater than $T_2$, the stored charge of the symbol falls into the rightmost region 154 and the detector 120 stores a value of 1 as the input state of that symbol. Otherwise, it is determined that the stored charge is between $T_1$ and $T_2$; the symbol then falls into the middle region 152 and the detector 120 stores the input state of that symbol as "erased" or 0. The input states determined for the detector sample 122 are stored in memory as variable nodes or symbols of the sampled codeword. This memory is termed the "hard decision memory", which may be in a different memory location from the received codeword 118.

In some arrangements, each symbol is assigned to one of more than three states. For example, there may be one or more thresholds between $T_1$ and $T_2$, and the erased state may be separated into "high erase" and "low erase" states; "high erase", "middle erase", and "low erase" states; and so forth. It is the goal of the decoder 124 to assign a binary value (e.g., 0 or 1) to each of the symbols initially assigned to an erase state. In general, if the thresholds cause too many symbols to be erased, the decoding algorithm may not be able to efficiently or accurately assign values to all of the erased symbols. On the other hand, if too few symbols are erased, the original assignments of the symbols may be too error prone and hinder the decoder 124. Thus, the two or more thresholds may be optimized based on the received codeword 118.

FIGS. 2A and 2B show a graphical illustration of communications between variable nodes 220-234 representing a sampled codeword and check nodes 200-210 for decoding the codeword in accordance with some arrangements.

After the variable nodes 220-234 are assigned input states or values using the detector 120 as described above in relation to FIG. 1B or 1C, a check of the variable nodes is performed by the detector 124 on a plurality of groups of variable nodes. The detector 124 uses processing rules of a check algorithm to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B, the parity check matrix H 126 may be as follows:

$$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. The decoder 124 references the parity check matrix H 126 to identify which variable nodes should be checked by a particular check node. For example, for the check node 206, the decoder 124 determines that check node 206 stores the result of a check of variable nodes 222, 224, 230, and 234 (i.e., the second, third, sixth, and eighth variable nodes). Then, the decoder 124 retrieves the values stored in these variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. In reality, the variable node values are retrieved by the decoder 124, which processes the values on behalf of the check node 206 according to the processing rules. From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" of the check node) is stored in syndrome memory, which stores syndrome values or indications of the check nodes. In some cases in the two-read scenario, the processor may receives values of "erased" from the variable nodes and does not identify whether or not the condition of a check node is satisfied. In such cases, the check node may indicate that the check is undetermined. Exemplary processing rules for determining the conditions of the check nodes in a two-read scenario are discussed in U.S. patent application Ser. No. 13/276,525, entitled "SYSTEMS AND METHODS FOR PERFORMING BIT FLIPPING IN AN LDPC DECODER" which is hereby incorporated by reference herein in its entirety.

After the indications or syndrome values for the check nodes 200-210 have been stored in the syndrome memory, the values of the variable nodes 220-234 are updated based on the values of the check nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 (e.g., 0 or 1 for a one-read scenario, or −1, 0, or 1 for a two-read scenario) may be updated. In some arrangements, the state of the variable node 224 may also be determined based in part on whether the variable node 224 had previously been updated, toggled, or flipped, as described in relation with respect to FIGS. 3A to 6B.

If the value of each variable node is assigned to one of three or more states (e.g., in a two or more-read scenario), two or more bits are used to store each assigned state. For example, three-state input typically requires two-bit storage. However, since two bits can store up to four states, storing the value of each variable node in two dedicated bits is not memory efficient. The storage can be reduced using a memory-combine approach wherein multiple hard decision memory cells for storing variable nodes are combined into blocks. In general, the assigned states of $G_v$ variable nodes each having N possible states can be described by a minimum of $N^{G_v}$ different values. For example, if the values of three variable nodes each assigned to one of three states are stored together in a single block, the values of the variable nodes in the block can be described by one of $3^3=27$ values. The number of bits needed to store 27 different values, then, is $\log_2(27)=4.755<5$. The efficiency in this case is 5 bits÷3 variable nodes=1.6667 bits/node. This is superior to the 2 bits/node that would be required without memory combining.

For greater efficiency in the three-state example, if the block size is five nodes rather than three nodes, the values of the variable nodes in the block can be described by one of $5^3=243$ values. The number of bits needed to store 243 different values is $\log_2(243)=7.928<8$. The efficiency in this case is 8 bits÷5 variable nodes=1.6 bits/node.

Similarly, check nodes stored in syndrome memory can be combined. In various arrangements, the check nodes can be one of two states, three states, four states, or other number of states. If the number of possible states is not a power of two, for memory efficiency, the check nodes can be grouped into blocks and combined, as described above.

FIG. 3A shows a flow chart for method 300 for applying a processing rule used to determine whether to toggle a variable node based in part on whether the variable node was previously toggled. At 302, the decoder 124 identifies a number of satisfied and unsatisfied check nodes for a particular variable node. As described in relation to FIG. 2B, for a given variable node, the decoder 124 uses the parity check matrix H 126 to determine which check nodes should be accessed. Then, for the variable node being decoded, the decoder 124 retrieves the check value of each check node indicated by the parity check matrix H 126 and identifies the number of check values that indicate a check is satisfied, the number of check values that indicate a check is unsatisfied, or both. In two or more-read scenarios, the decoder 124 may also identify the number of check nodes that are undetermined or that store another check value.

At 304, the decoder 124 identifies whether the variable node has been toggled previously. For example, the decoder 124 may access a flip or toggle state memory that, for each variable node, stores an indication of whether the variable node has been flipped or toggled previously. In another example, the decoder 124 accesses a received value state memory or received signal state memory that stores the original received value or signal of each symbol of the detector sample 122; the decoder 124 then compares the original value or signal to the current value of the variable node to determine whether the variable node has been flipped or toggled. These and other methods for identifying whether the variable node has been flipped or toggled are described further in relation to FIGS. 4A through 6B. In some embodiments, the decoder 124 only identifies whether the variable node has been toggled previously in certain defined situations, e.g., if more than a lower threshold of satisfied check values are retrieved at 302, or if less than an upper threshold of unsatisfied checks are retrieved at 302.

At 306, the decoder 124 determines whether to flip or toggle the value of the variable node based on the check values received at 302 and based on whether the variable node has been previously flipped or toggled as determined at 304. The decoder may determine whether to toggle the value of the variable node based on the check values received at 302, whether the variable node has been previously flipped or toggled as determined at 304, or based on criteria relating to both the check values and previous flipping or toggling. The rules used for determining whether to flip or toggle the value of the variable node may vary within a single decoding process. Particular rules for determining whether to flip or toggle the value of the variable node are described in relation to FIG. 4A through 6B.

Figure 3B:
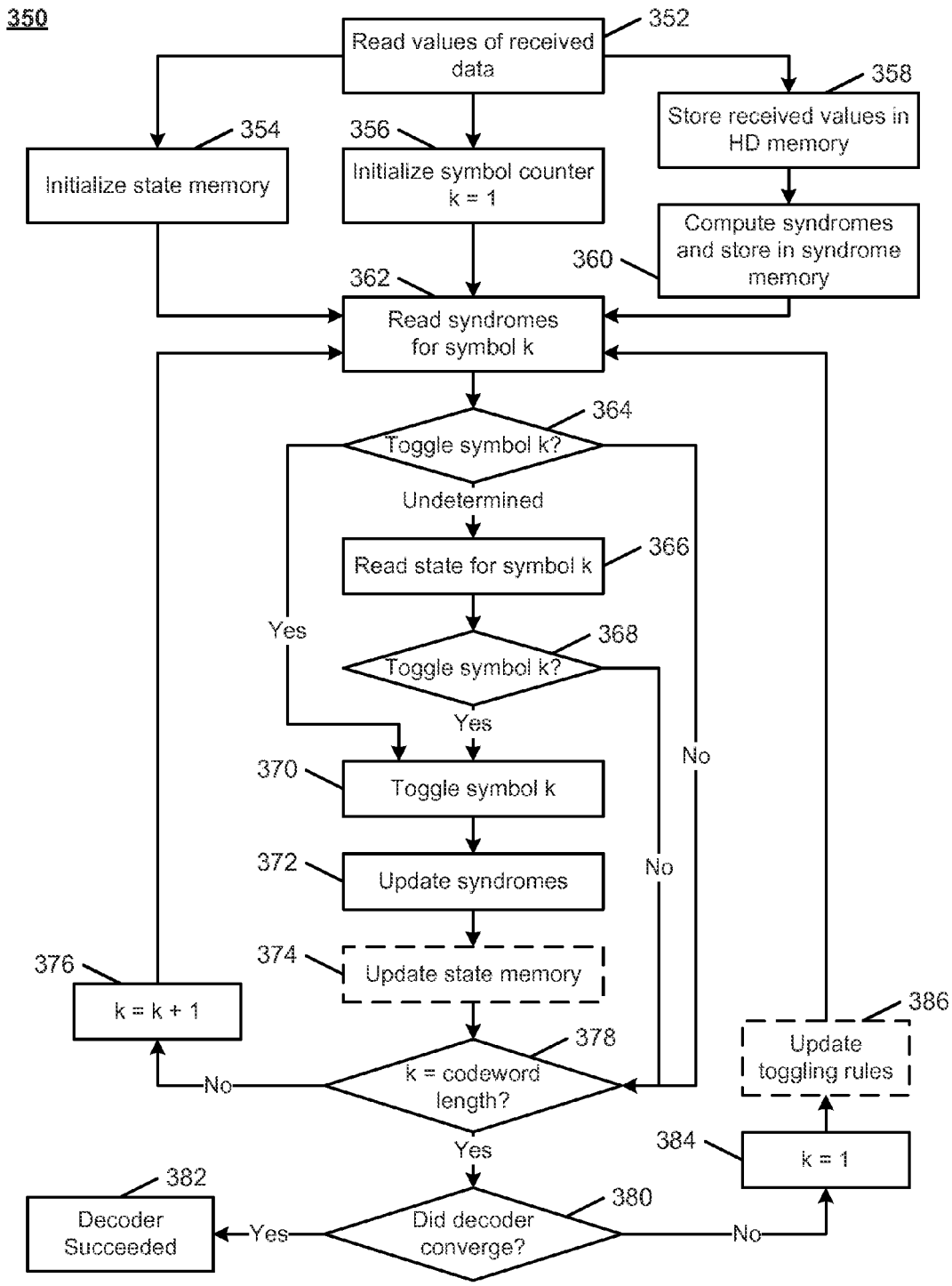
FIG. 3B shows a flow chart for a method of decoding a received codeword by applying the processing rule shown in FIG. 3A, in accordance with some arrangements.

FIG. 3B shows a flow chart for a method 350 of decoding a received codeword 118 by applying the processing rule shown in FIG. 3A. At 352, the detector 120 reads the values of the received codeword 118 as described in relation to FIG. 1B or 1C to generate a detector sample 122. At 354, the decoder initializes a state memory, which stores data that indicates or that can be used to determine whether variable nodes have been previously flipped or toggled. At 358, the decoder initializes a hard decision (HD) memory by storing the original values (for a one-read scenario) or signals (for a two or more-read scenario) of the detector sample 122 in variable nodes in the HD memory. At 360, the decoder 124 computes syndromes based on the data stored in the HD memory as described in relation to FIG. 2A, and the decoder 124 stores the computed syndromes in check nodes in a syndrome memory. At 356, the decoder 124 initializes the variable node counter k=1; in the decoding process, the decoder 124 iterates through each of the variable nodes in the detector sample 122, where each variable node corresponds to a symbol of the codeword being decoded.

At 362, the decoder 124 reads the syndromes stored in the check nodes for symbol k of the codeword, as described in relation to FIG. 2B. The decoder 124 may process the syndromes to identify a number of satisfied checks, a number of unsatisfied checks, or both, as described in relation to 302 of FIG. 3A. At 364, the decoder 124 determines whether to toggle symbol k based on the syndromes for symbol k. For example, if the decoder 124 has received more than a first pre-specified threshold of satisfied checks for symbol k, the decoder 124 determines not to toggle symbol k. In this case, the process proceeds to decision 378, discussed further below. If the decoder 124 has received more than a second pre-specified threshold of unsatisfied checks for symbol k, the decoder 124 determines to toggle symbol k. In this case, the process proceeds to 370, Toggle Symbol k. Finally, if neither a condition to toggle symbol k nor a condition not to toggle symbol k has been met, the decision 364 to toggle symbol k is undetermined, and the decoder 124 proceeds to 366, Read state for symbol k. For example, the decoder 124 may not be able to determine whether to toggle symbol k if, for symbol k, it has received less than the first threshold of satisfied checks for symbol k and less than the second threshold of unsatisfied checks for symbol k.

At 366, the decoder 124 reads the state information for symbol k from the state memory. The state information stores the original received value of each symbol of the detector sample 122, the original received signal of each symbol of the detector sample 122, an indication of whether each variable node has been previously toggled, or any other information or prior combination of information relating to prior values or toggling of the variable nodes. At 368, the decoder 124 determines whether to toggle symbol k based on the received state information for symbol k and the received syndromes for symbol k. For example, if the decoder 124 has received more than a third pre-specified threshold of satisfied checks for symbol k and symbol k has not been toggled previously, the decoder 124 may determine not to toggle symbol k and proceed to 378. As another example, if the decoder 124 has received more than a fourth pre-specified threshold of unsatisfied checks for symbol k and symbol k has been toggled previously, the decoder 124 may decide to toggle symbol k and proceed to 370. Further decision rules for determining whether to toggle a symbol are described in relation to FIGS. 4A through 6B.

If the decoder 124 decides at 364 or 368 to toggle symbol k, at 370, symbol k is toggled. For a one-read scenario, toggling symbol k involves switching from one binary value to the other binary value, e.g., switching from 1 to 0 or from 0 to 1. In higher-read scenarios, symbol k could be toggled between hard-decisions (e.g., 1 and 0) and any number of erasure states as dictated by the number of reads used and by the toggling decision rules. At 372, the decoder 124 updates the syndrome memory to reflect the value of the toggled variable node. In particular, the syndrome for of each check node that checks the variable node for symbol k is recomputed, and the values of those check nodes are updated. In some embodiments, e.g., if the state memory stores an indication of whether a symbol has been toggled, the state memory for symbol k is updated at 374.

At 378, the decoder 124 determines whether k equals the codeword length, i.e., that the process of 362 through 374 has been performed on each variable node in the detector sample 122 and the end of the detector sample 122 has been reached. If the end of the detector sample 122 has not been reached, k is incremented, and the process of 362 through 374 is performed on the following variable node (i.e., the following symbol k) in the detector sample.

Note that the decoder 124 does not access the state memory for symbol k unless the decoder 124 cannot determine whether to toggle symbol k from the syndromes for symbol k accessed at 362. Thus, the decoder 124 is not required to access the state memory in each step. This requires less power than if the state memory were read in every step. Furthermore, the decoder 124 would not read the state memory during the first iteration through the detector sample 122, since none of the symbols in the detector sample 122 would have been toggled yet.

Once the end of the detector sample 122 has been reached, at 380, this indicates the end of one iteration of the decoding process. At this point 380, the decoder 124 determines whether the decoding process has converged. In some arrangements, this means that the conditions of all of the check nodes are satisfied. In other arrangements, where outer error correction codes may be present, conditions for convergence are relaxed, and a minimum amount of error (e.g., a minimum amount of erased variable nodes or a minimum amount of unsatisfied check nodes) is permitted. If the decoder 124 has converged, at 382, it is determined that the decoder 124 succeeded. The decoder 124 then outputs the decoded message 128 to the receiving user or application 130. If the decoder 124 did not converge, at 384, k is reset to 1, and in some arrangements, at 386, the toggling rules are updated for the following iteration through the detector sample 122. Various flipping and toggling rules and the updating of the flipping and toggling rules are described further in relation to FIGS. 4A through 6B.

In some arrangements, if the decoder 124 did not converge, before resetting k at 384 and iterating through the detector sample 122 again, the decoder 124 determines whether an iteration number j is less than a maximum number of iterations $j_{max}$. If the iteration number j is less than the maximum number of iterations $j_{max}$, the process continues to 384 and the variable nodes are processed again. If the iteration number j is not less than the maximum number of iterations $j_{max}$, the method terminates. After terminating, the decoder 124 may output the result of the decoding to the receiving user or application 130. Additionally or alternatively, the decoder 124 or the receiving user or application 130 can request that the transmitting user or application 102 retransmit the codeword 110. The decision of whether to accept the message or request the message be resent may be based on the degree to which the decoder 124 determines that the decoded message 128 is incorrect.

Figure 4A:
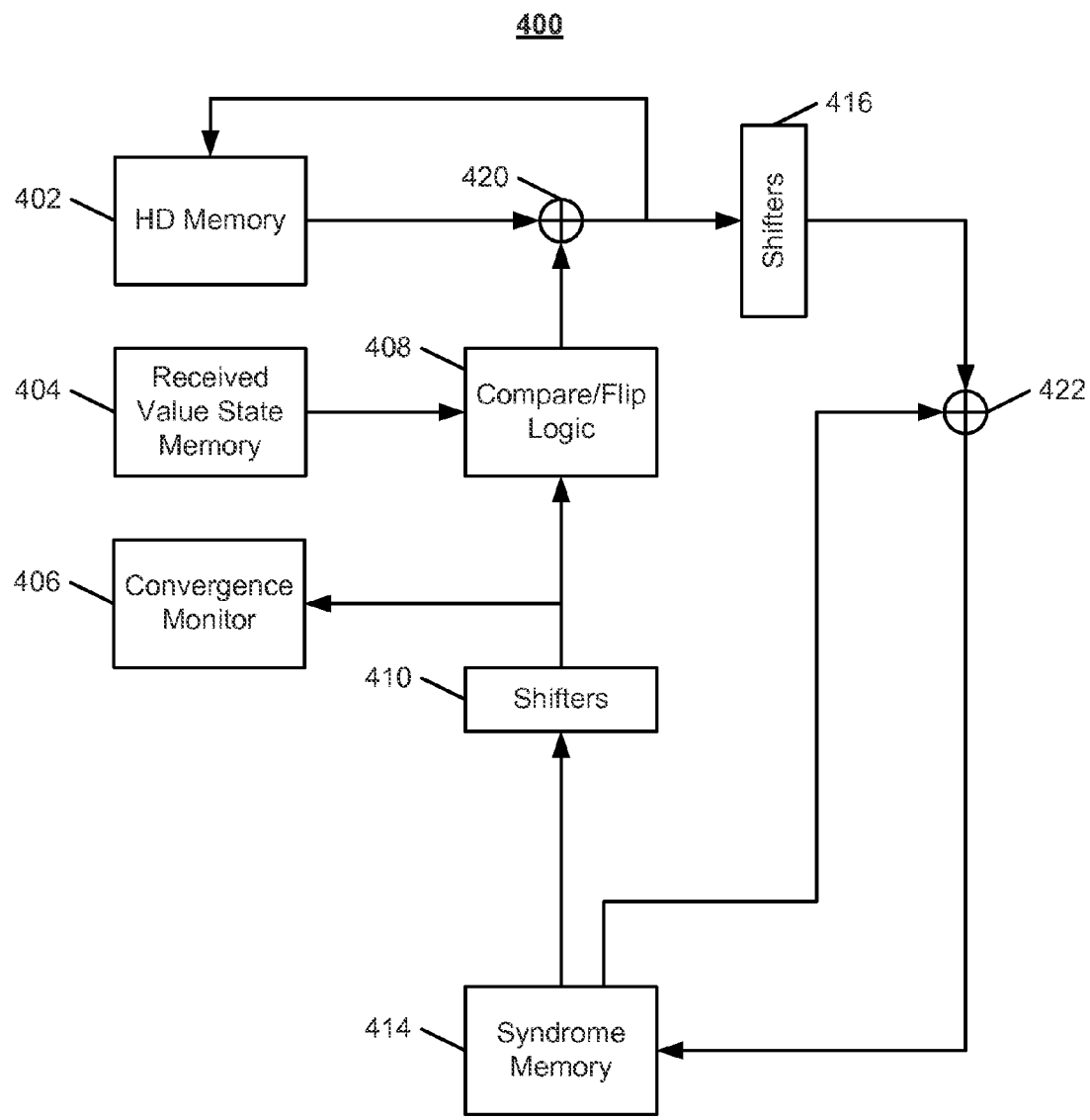
FIG. 4A shows a hardware implementation for decoding a received codeword by applying the processing rule shown in FIG. 3A in which data stored in a received value state memory is used to identify whether symbols of the codeword have been previously toggled, in accordance with some arrangements.

FIG. 4A shows a decoder hardware implementation 400 for decoding a detector sample 122 that was generated through a single-read process, such as the single-read process described in relation to FIG. 1B. The hardware implementation 400 includes three memories 402, 404, and 414, a compare/flip logic device 408, a convergence monitor 406, and several XOR gates 420 and 422, and shifters 410 and 416, The detector sample 122 is stored in a hard-decision (HD) memory 402 in variable nodes, each of which stores a binary value (e.g., 1 or 0). The original values of the detector sample 122 are also stored in a received value state memory 404. The received value state memory 404 is one suitable implementation of a state memory as described in relation to FIG. 3B. Indications of determined conditions are stored in a syndrome memory 414 at check nodes, as described in relation to FIG. 2A.

Compare/flip logic 408 is a device for determining whether to flip or toggle the symbol stored at a particular variable node, e.g., based on the processing rule of FIG. 3A. The compare/flip logic 408 is communicatively coupled to the received value state memory 408 so that the received values can be used to determine whether or not to flip or toggle a particular variable node. The compare/flip logic 408 also can receive signals from the syndrome memory 414 via shifters 410 so that the syndromes indicated by the check nodes can be used to determine whether or not to flip or toggle a particular variable node.

In particular, the compare/flip logic 408 determines, for a particular variable node, whether, based on the check nodes for that variable node, that variable node should be flipped/toggled. For example, in the single-read arrangements described in FIG. 1B, based on check node processing rules, the compare/flip logic 408 may determine that the variable node should be flipped (as described above in relation to 364 of FIG. 3B). In that instance, the compare/flip logic 408 outputs a "1" to the XOR gate 420. Then, the "1" output by the compare/flip logic 408 is XORed with the current value of the variable node received at the XOR gate 420 from the HD memory 402. This causes the opposite value from current value of the variable node to be output from the XOR gate 420 and stored to the variable node in the HD memory 402, thus flipping the variable node. If, based on the check node processing rules, the compare/flip logic 408 determines that the variable node should not be flipped (as described above in relation to 364 of FIG. 3B), the compare/flip logic 408 outputs a "0" to the XOR gate 420. Accordingly, when the 0 output by the compare/flip logic 408 is XORed with the current value of the variable node, the same value as current value of the variable node is output from the XOR gate 420 and stored to the variable node in the HD memory 402, so the variable node is not flipped.

If the compare/flip logic 408 cannot determine whether the variable node should be flipped based on the check node processing rules, the compare/flip logic 408 accesses the received value of that variable node from the received value state memory 404, as described above in relation to 364 and 366 of FIG. 3B. The compare/flip logic 408 compares the received value of the variable node to the current value of the variable node to determine whether the variable node has been flipped. The compare/flip logic 408 determines whether to flip the variable node and outputs a 1 to flip or a 0 to not flip, as discussed above. Particular rules for determining when to flip the variable node are described in relation to FIG. 4B.

Convergence monitor 406 is a device for determining, based on the conditions stored in the check nodes of the syndrome memory 414, whether the decoder 400 has converged, as described in relation to 380 of FIG. 3B.

Figure 4B:
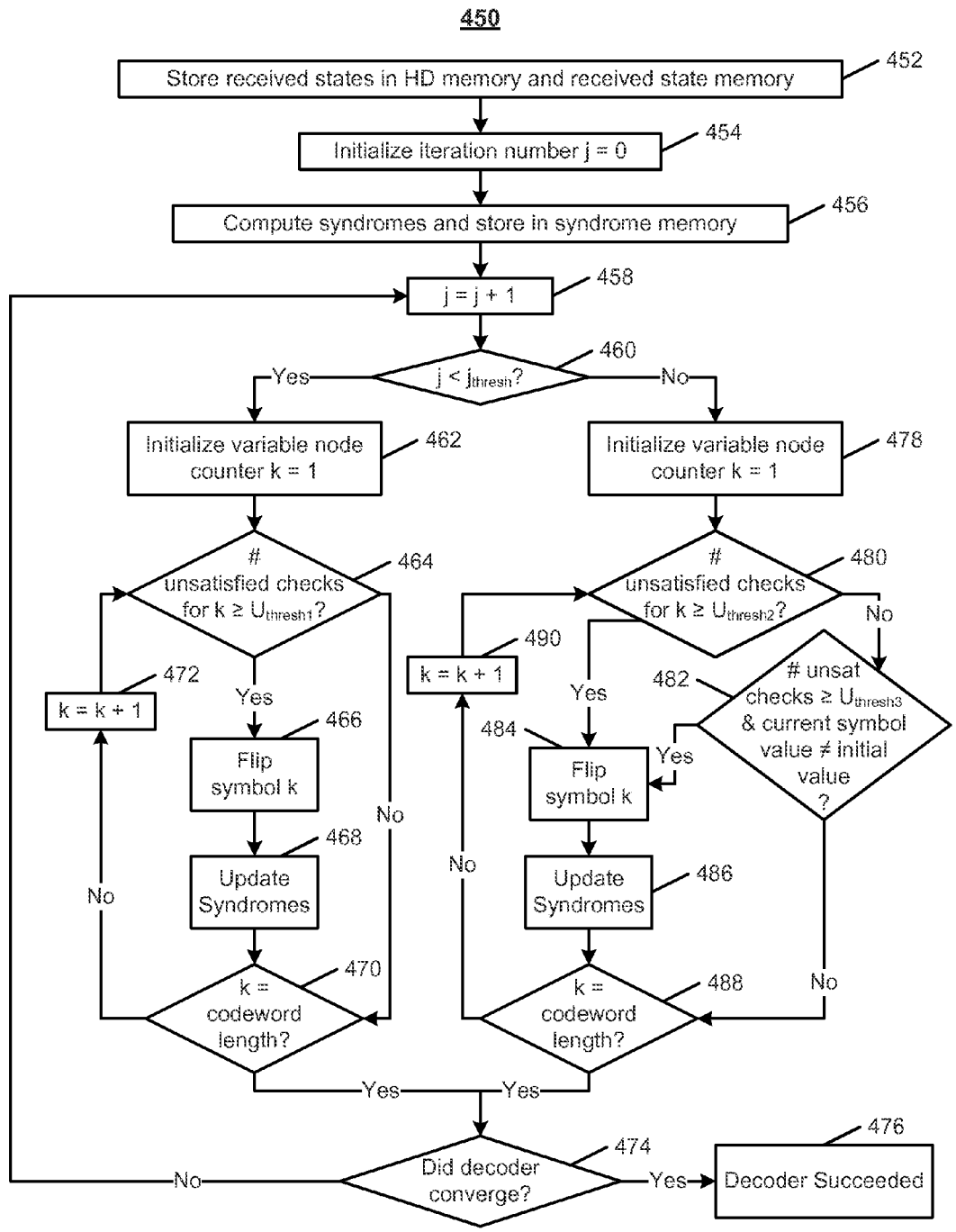
FIG. 4B shows a flow chart for a method of decoding a received codeword using the hardware of FIG. 4A, in accordance with some arrangements.

FIG. 4B shows a flow chart for a method 450 of decoding a codeword using the hardware of FIG. 4A. At 452, the received states of the detector sample 122 are stored in the HD memory 402 and in the received value state memory 404. At 454, the iteration number j is initialized to 0; the iteration number j is incremented each time the decoder 400 iterates through all of the variable nodes in the HD memory 402. At 456, with j=0, the decoder 400 computes the syndromes based on the values of the variable nodes and stores the syndromes in check nodes in the syndrome memory 414. At 458, the decoder 400 increments j=j+1. At 460, the decoder 400 compares j to a threshold $j_{thres}$ to determine whether to use the left-branch flipping rules (462-472) or to use the right-branch flipping rules (478-490). In this embodiment, the left-branch flipping rules do not utilize data stored in the received value state memory 404, whereas the right-branch flipping rules do involve the received value state memory 404. In some arrangements, $j_{thres}=2$, and the left-branch is only used in the first iteration when the received value state memory 404 would not be meaningful since the received values are the same as the variable node values (i.e., no variable nodes have yet been flipped). In other arrangements, $j_{thres}$ is greater than 2. In addition, while FIG. 4B shows two branches with flipping rules, in other arrangements, more branches of flipping rules may be used.

If $j<j_{thres}$, at 462, the decoder 400 initializes a variable node counter k=1, which is similar to the counter k described in relation to FIG. 3B. At 464, after receiving data from the syndrome memory 414 identifying which check nodes for variable node k are satisfied and which are unsatisfied, the compare/flip logic 408 determines whether the number of unsatisfied checks is greater than or equal to a first given threshold $U_{thresh1}$. For example, if each variable node is connected to 4 check nodes, $U_{thresh1}$ may be 4, so that the value of a variable node is only flipped if all four checks of the variable node are unsatisfied.

If the compare/flip logic 408 determines that the number of unsatisfied checks is greater than or equal to the first given threshold $U_{thresh1}$, at 466, the compare/flip logic 408 flips the symbol k by outputting a "1", as described in relation to FIG. 4A. At 468, the decoder 400 then updates the syndromes stored in the check nodes of syndrome memory 414 based on the new value of the flipped variable node. At 470, the decoder 400 determines whether the variable node counter k has reached the length of the codeword; if, at 464, the compare/flip logic 408 determined that the number of unsatisfied checks is not greater than or equal to the first given threshold $U_{thresh1}$, the decoder 400 moves immediately to 470. If k is less than the length of the codeword, then at 472, the decoder 400 increments k and returns to 464. If k is equal to the length of the codeword, then at 474, the convergence monitor 406 determines, based on the data stored in the syndrome memory 414, whether the decoder 400 has converged. If the decoder 400 has converged, at 476, the decoder 400 has succeeded. The decoder 400 then outputs the decoded message 128 to the receiving user or application 130. If the decoder 400 has not converged, at 458, the iteration number j is incremented, and j is compared to $j_{thres}$ at 460.

If, at 460, j is not less than $j_{thres}$, then at 478, the decoder 400 initializes a variable node counter k=1, which is similar to the counter k described in relation to FIG. 3B. At 480, after receiving data from the syndrome memory 414 identifying which check nodes for variable node k are satisfied and which are unsatisfied, the compare/flip logic 408 determines whether the number of unsatisfied checks is greater than or equal to a second given threshold $U_{thresh2}$. For example, if each variable node is connected to 4 check nodes, $U_{thresh2}$ may be 3, so that the value of a variable node is flipped if three or four of the four checks of the variable node are unsatisfied.

If the compare/flip logic 408 determines that the number of unsatisfied checks is greater than or equal to the second given threshold $U_{thresh2}$, at 484, the compare/flip logic 408 flips the symbol k by outputting a "1", as described in relation to FIG. 4A. At 486, the decoder 400 then updates the syndromes stored in the check nodes of syndrome memory 414 based on the new value of the flipped variable node. At 488, the decoder 400 determines whether the variable node counter k has reached the length of the codeword. If k is less than the length of the codeword, then at 490, the decoder 400 increments k and returns to 480.

If, at 480, the compare/flip logic 408 determines that the number of unsatisfied checks is not greater than or equal to than the second given threshold $U_{thesh2}$, then at 482, the compare/flip logic 408 determines whether the number of unsatisfied checks is greater than or equal to a third given threshold $U_{thresh3}$ AND, based on data received from the received value state memory 404, whether the current value of the variable node (i.e., the current symbol value) is different from its original received value, which indicates that the variable node has been flipped before. If both of these conditions are met, the compare/flip logic 408 flips the symbol k by outputting a "1", as described in relation to FIG. 4A, and, at 486, the decoder 400 updates the syndromes as described above. If one or both of the aforementioned conditions of decision 482 are not met, the process proceeds to 488 to determine whether the end of the codeword has been reached.

Once, at 488, the decoder 400 determines that k is equal to the length of the codeword, then at 474, the convergence monitor 406 determines, based on the data stored in the syndrome memory 414, whether the decoder 400 has converged. If the decoder 400 has converged, at 476, the decoder 400 has succeeded. The decoder 400 then outputs the decoded message 128 to the receiving user or application 130. If the decoder 400 has not converged, at 458, the iteration number j is incremented.

Figure 5A:
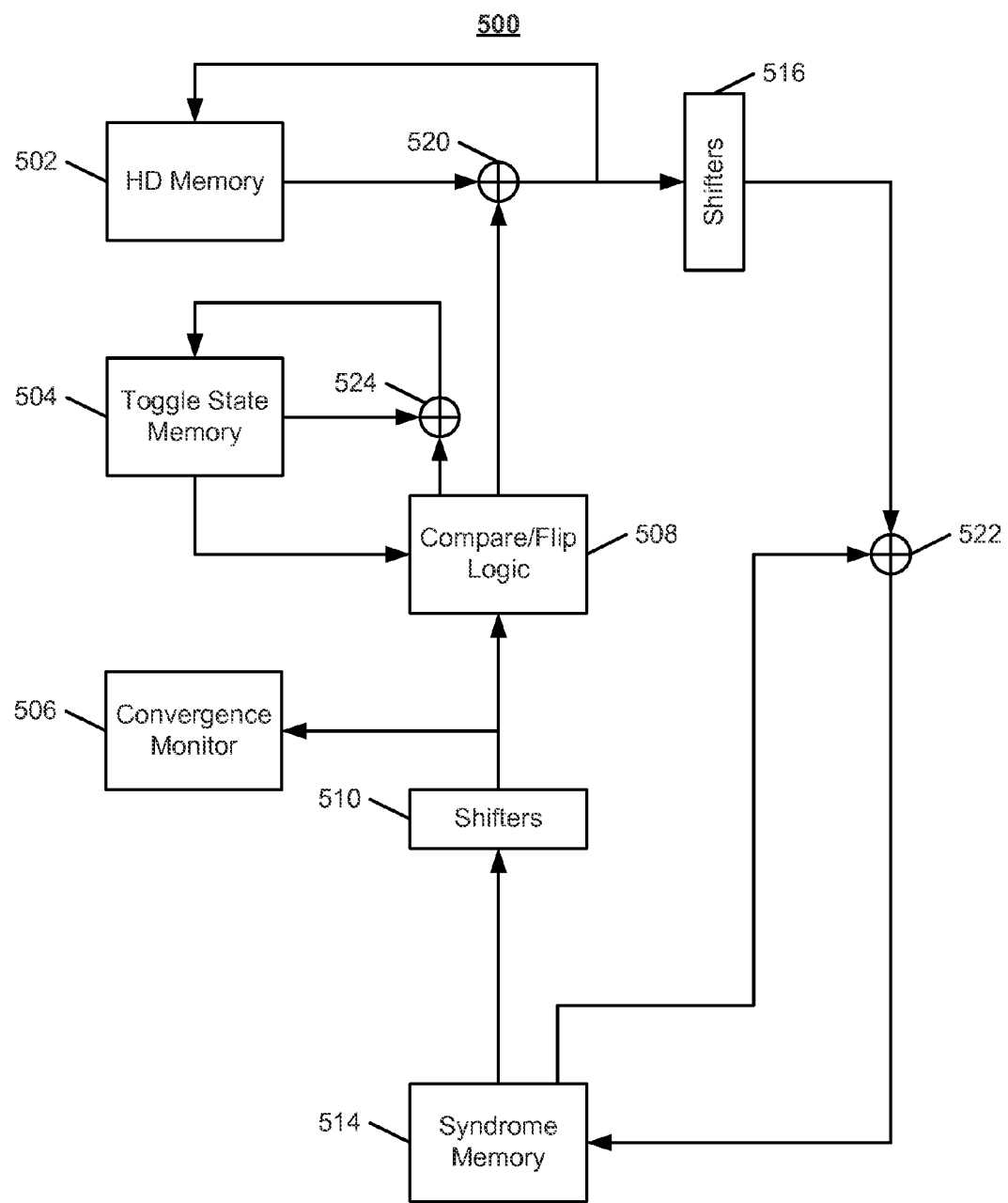
FIG. 5A shows a hardware implementation for decoding a received codeword by applying the processing rule shown in FIG. 3A in which data indicating whether symbols of the codeword have been previously toggled is stored in a flip state memory, in accordance with some arrangements.

FIG. 5A shows a second decoder hardware implementation 500 for decoding a detector sample 122 that was generated through a single-read process, such as the single-read process described in relation to FIG. 1B. The hardware implementation 400 includes three memories 502, 504, and 514, a compare/flip logic device 508, a convergence monitor 506, and several XOR gates 520, 522, and 524, and shifters 510 and 516.

The detector sample 122 is stored in a hard-decision (HD) memory 502 as variable nodes, each of which stores a binary value (e.g., 1 or 0). Indications of determined conditions are stored in a syndrome memory 514 at check nodes, as described in relation to FIG. 2A. The flip state memory 504 stores information relating to whether a variable node has been flipped before. The flip state memory 504 is one suitable implementation of a state memory as described in relation to FIG. 3B.

In some arrangements, once a variable node has been flipped, the flip state memory 504 stores an indication that the variable node has been flipped and does not change or reset this indication for the remainder of the decoding process. In some arrangements, the flip state memory 504 stores an indication of whether each variable node has been flipped within a set number of iterations. For example, the flip state memory 504 can store an indication of whether each variable node has been flipped in the most recent iteration through the variable nodes; in one such arrangement, if a variable node is flipped, a location in the flip state memory 504 corresponding to that variable node is set to "1", and if the variable node is not flipped, a location in the flip state memory 504 corresponding to that variable node is set to "0".

In other arrangements, the flip state memory 504 stores an indication of whether each variable node has been flipped in the most recent N iterations. For example, for a single variable node, the flip state memory may store a "flipped" marker and an iteration counter. If a variable node is flipped, the "flipped" marker is set to 1 and the iteration number is set to 0. Each time the decoder 500 decides not to flip the variable node, the iteration number is incremented. Once the iteration number reaches N, the "flipped" marker is set to 0.

In the arrangement shown in FIG. 5A, if a variable node is flipped once, the previous flip state corresponding to the variable node is XORed with the flip instruction (i.e., a "1") at XOR gate 524. This causes the opposite value of the previous flip state corresponding to the variable node to be returned and stored in the flip state memory 504. In this arrangement, if the variable node is flipped a second time, the flip state will be the same as if the variable node had never been flipped.

If the variable node is flipped before N is reached, the iteration counter for that variable node is reset to 0. Still other rules can be used recording the flip history of each variable node in the flip state memory 504, and the rules used (e.g., the number of iterations N through which a variable node is marked as "flipped") may change during the decoding process. The decoder 500 may alternatively send data to the flip state memory 504 without passing it through an XOR gate or XORing the toggle instructions with the previous toggle state.

Compare/flip logic 508 is a device for determining whether to flip a particular variable node, e.g., based on the processing rule of FIG. 3A. The compare/flip logic 508 is communicatively coupled to the flip state memory 504 so that the received values can be used to determine whether or not to flip a particular variable node. The compare/flip logic 508 also can receive signals from the syndrome memory 514 via shifters 510 so that the syndromes indicated by the check nodes can be used to determine whether or not to flip a particular variable node.

In particular, the compare/flip logic 508 determines, for a particular variable node, whether, based on the check nodes for that variable node, that variable node should be flipped. If, based on check node processing rules, the compare/flip logic 508 determines that the variable node should be flipped (as described above in relation to 364 of FIG. 3B), the compare/flip logic 408 outputs a "1" to the XOR gate 520. Then, the "1" output by the compare/flip logic 508 is XORed with the current value of the variable node received at the XOR gate 520 from the HD memory 502. This causes the opposite value from current value of the variable node to be output from the XOR gate 520 and stored to the variable node in the HD memory 502, thus flipping the variable node. If, based on the check node processing rules, the compare/flip logic 508 determines that the variable node should not be flipped (as described above in relation to 364 of FIG. 3B), the compare/flip logic 508 outputs a "0" to the XOR gate 520. Accordingly, when the 0 output by the compare/flip logic 508 is XORed with the current value of the variable node, the same value as current value of the variable node is output from the XOR gate 520 and stored to the variable node in the HD memory 502, so the variable node is not flipped.

If the compare/flip logic 508 cannot determine whether the variable node should be flipped based on the check node processing rules, the compare/flip logic 508 accesses the flip information for that variable node from the flip state memory 504, as described above in relation to 364 and 366 of FIG. 3B. The compare/flip logic 508 uses the prior flipping information for the variable node to determine whether to flip the variable node. Based on the determination, the compare/flip logic outputs a 1 to flip the variable node or a 0 to not flip the variable node, as discussed above. Particular rules for determining when to flip the variable node are described in relation to FIG. 5B.

Convergence monitor 506 is a device for determining, based on the conditions stored in the check nodes of the syndrome memory 514, whether the decoder 500 has converged, as described in relation to 380 of FIG. 3B.

Figure 5B:
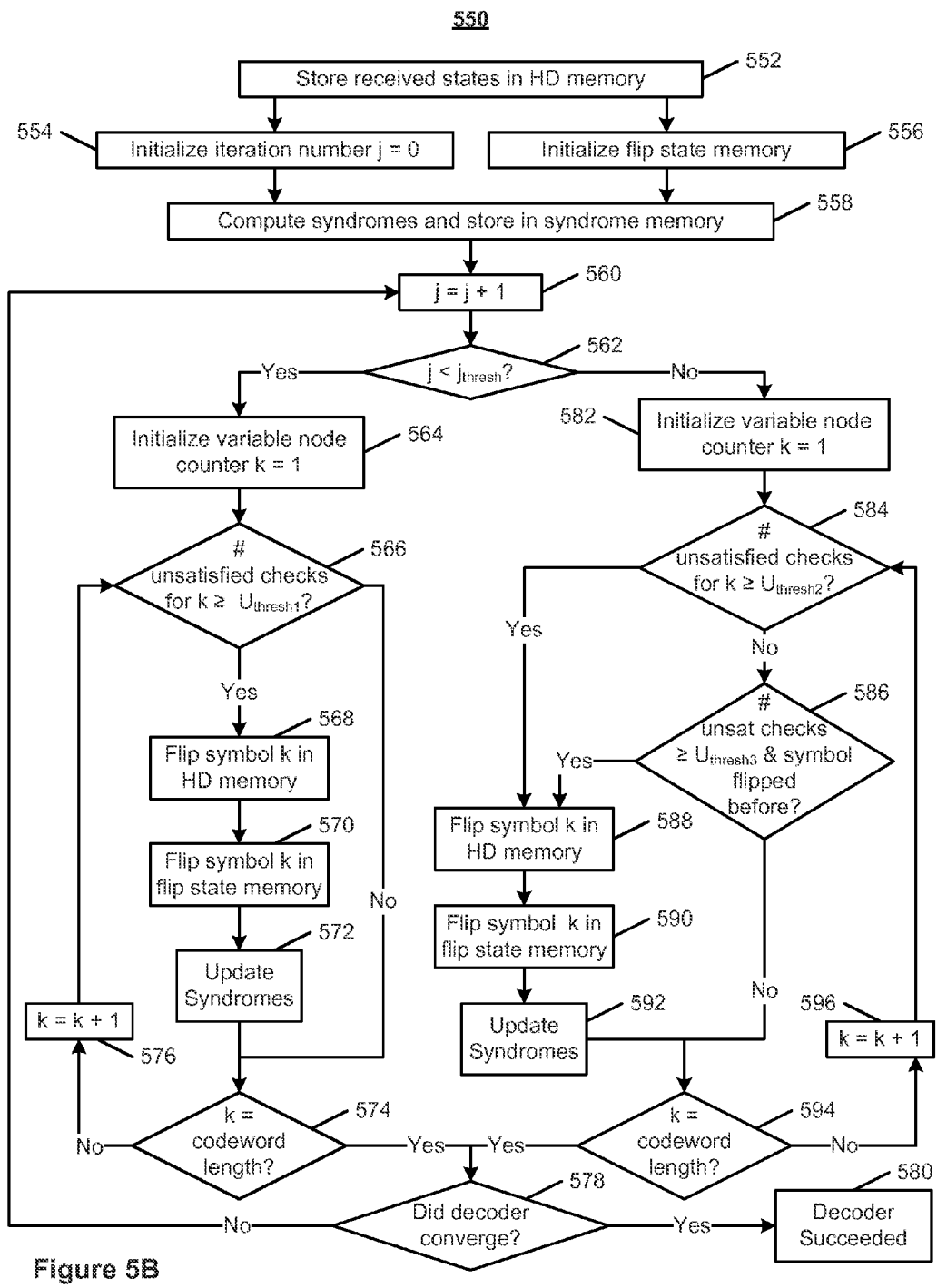
FIG. 5B shows a flow chart for a method of decoding a received codeword using the hardware of FIG. 5A, in accordance with some arrangements.

FIG. 5B shows a flow chart for a method 550 of decoding a codeword using the hardware of FIG. 5A. At 552, the received states of the detector sample 122 are stored in the HD memory 502. At 554, the iteration number j is initialized to 0; the iteration number j is incremented each time the decoder 500 iterates through all of the variable nodes in the HD memory 502. At 556, the flip state memory 504 is initialized. For example, a set of values in which each value corresponds to one of the variable nodes can all be set to "0" to indicate that the corresponding variable nodes have not been flipped. At 558, with j=0, the decoder 500 computes the syndromes based on the values of the variable nodes and stores the syndromes in check nodes in the syndrome memory 514. At 560, the decoder 500 increments j=j+1. At 562, the decoder 500 compares j to a threshold $j_{thres}$ to determine whether to use the left-branch flipping rules (564-576) or to use the right-branch flipping rules (582-596). In this embodiment, the left-branch flipping rules do not utilize data stored in the flip state memory 504, whereas the right-branch flipping rules do involve the flip state memory 504. In some arrangements, $j_{thres}$=2, and the left-branch is only used when the flip state memory 504 would not be meaningful since none of the variable node have been flipped. In other arrangements, $j_{thres}$ is greater than 2. In addition, while FIG. 5B shows two branches with flipping rules, in other arrangements, more branches of flipping rules may be used.

If $j<j_{thres}$, at 564, the decoder 500 initializes a variable node counter k=1; k is similar to the counter k described in relation to FIG. 3B. At 566, after receiving data from the syndrome memory 514 identifying which check nodes for variable node k are satisfied and which are unsatisfied, the compare/flip logic 508 determines whether the number of unsatisfied checks is greater than or equal to a first given threshold $U_{thresh1}$. For example, if each variable node is connected to 4 check nodes, $U_{thresh1}$ may be 4, so that the value of a variable node is only flipped if all four checks of the variable node are unsatisfied.

If the compare/flip logic 508 determines that the number of unsatisfied checks is greater than or equal to the first given threshold $U_{thresh1}$, at 568, the compare/flip logic 508 flips the symbol k by outputting a "1", as described in relation to FIG. 5A. At 570, the decoder 500 updates the flip state memory 504 to indicate that the variable node has been flipped. For example, the decoder 500 may flip the $k^{th}$ symbol (which corresponds to the $k^{th}$ variable node) in the flip state memory 504. As described above in relation to FIG. 5A, the decoder 500 may also reset an iteration counter corresponding to the variable node. The decoder 500 may store or update any other information relating to whether and when the variable node was flipped in the flip state memory 504.

At 572, the decoder then updates the syndromes stored in the check nodes of syndrome memory 514 based on the new value of the flipped variable node. At 574, the decoder 500 determines whether the variable node counter k has reached the length of the codeword; if, at 566, the compare/flip logic 408 determined that the number of unsatisfied checks is not greater than or equal to the first given threshold $U_{thresh1}$, the decoder 500 moves immediately to 574. If k is less than the length of the codeword, then at 576, the decoder 500 increments k and returns to 566. If k is equal to the length of the codeword, then at 578, the convergence monitor 506 determines, based on the data stored in the syndrome memory 514, whether the decoder 500 has converged. If the decoder 500 has converged, at 580, the decoder 500 has succeeded. The decoder 500 then outputs the decoded message 128 to the receiving user or application 130. If the decoder 500 has not converged, at 560, the iteration number j is incremented, and j is compared to $j_{thres}$ at 562.

If, at 562, j is not less than $j_{thres}$, then at 582, the decoder 500 initializes a variable node counter k=1; k is similar to the counter k described in relation to FIG. 3B. At 584, after receiving data from the syndrome memory 514 identifying which check nodes for variable node k are satisfied and which are unsatisfied, the compare/flip logic 508 determines whether the number of unsatisfied checks is greater than or equal to a second given threshold $U_{thresh2}$. For example, if each variable node is connected to 4 check nodes, $U_{thresh2}$ may be 3, so that the value of a variable node is flipped if three or four of the four checks of the variable node are unsatisfied.

If the compare/flip logic 508 determines that the number of unsatisfied checks is greater than or equal to the second given threshold $U_{thresh2}$, at 588, the compare/flip logic 408 flips the symbol k by outputting a "1", as described in relation to FIG. 5A. At 590, the decoder 500 updates the flip state memory 504 to indicate that the variable node has been flipped. For example, the decoder 500 may flip the $k^{th}$ symbol (which corresponds to the $k^{th}$ variable node) in the flip state memory 504. As described above in relation to FIG. 5A, the decoder 500 may also reset an iteration counter corresponding to the variable node. The decoder 500 may store or update any other information relating to whether and when the variable node was flipped in the flip state memory 504.

At 592, the decoder 500 updates the syndromes stored in the check nodes of syndrome memory 514 based on the new value of the flipped variable node. At 592, the decoder 500 determines whether the variable node counter k has reached the length of the codeword. If k is less than the length of the codeword, then at 596, the decoder 500 increments k and returns to 480.

If, at 584, the compare/flip logic 508 determines that the number of unsatisfied checks is not greater than or equal to than the second given threshold $U_{thresh2}$, then at 586, the compare/flip logic 508 determines whether the number of unsatisfied checks is greater than or equal to a third given threshold $U_{thresh3}$ and, based on data received from the flip state memory 504, the variable node has been flipped before or has been flipped within a pre-determined number of prior of iterations. If both of these conditions are met, the compare/flip logic 508 flips the symbol k by outputting a "1", as described in relation to FIG. 5A. At 490, the decoder updates the flip state memory 504 as described above, and at 592, the decoder 400 updates the syndromes as described above. If one or both of the aforementioned conditions of decision 586 are not met, the process proceeds to 594 to determine whether the end of the codeword has been reached.

Once, at 594, the decoder 500 determines that k is equal to the length of the codeword, then at 578, the convergence monitor 506 determines, based on the data stored in the syndrome memory 514, whether the decoder 500 has converged. If the decoder 500 has converged, at 580, the decoder 500 has succeeded. The decoder 500 then outputs the decoded message 128 to the receiving user or application 130. If the decoder 500 has not converged, at 560, the iteration number j is incremented.

Figure 6A:
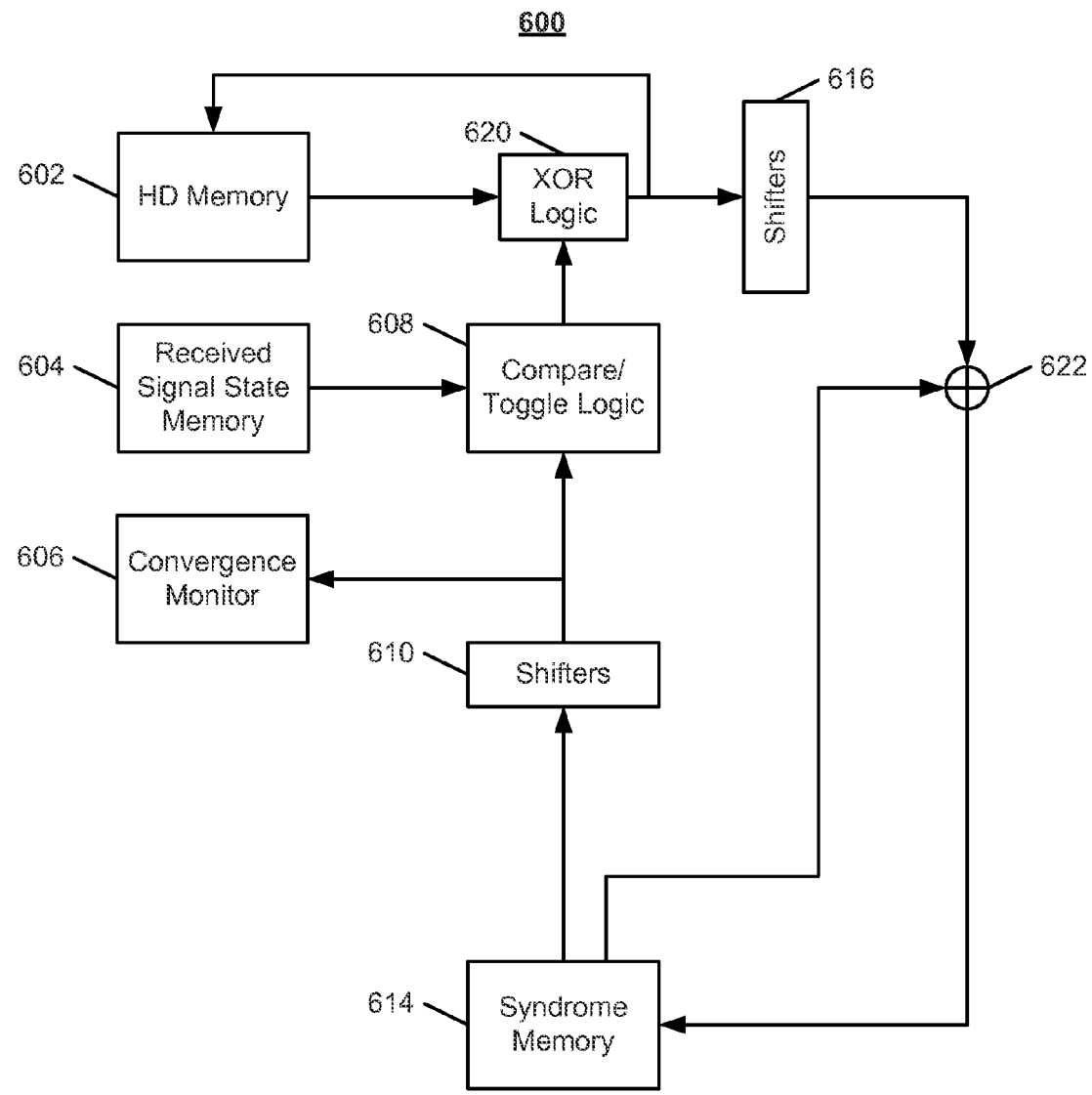
FIG. 6A shows a two-read hardware implementation for decoding a received codeword by applying the processing rule shown in FIG. 3A in which data stored in a received signal state memory is used to identify whether symbols of the codeword have been previously toggled.

FIG. 6A shows a decoder hardware implementation 600 for decoding a detector sample 122 that was generated through a multi-read (i.e., two or more-read) process as described, for example, in relation to FIG. 1C. The hardware implementation 600 includes three memories 602, 604, and 614, a compare/toggle logic device 608, a convergence monitor 606, and several XOR gates 620 and 622, and shifters 610 and 616.

The detector sample 122 is stored in a hard-decision (HD) memory 602 as variable nodes, each of which stores a binary value (e.g., 1 or 0) or erasure data. The original signals of the detector sample 122 are also stored in a received signal state memory 604. The received signal state memory 604 is one suitable implementation of a state memory as described in relation to FIG. 3B. In other arrangements, the received signal state memory 604 is replaced by a toggle state memory, which is similar to the flip state memory 504 described in relation to FIG. 5A, except that the toggle state memory stores data identifying whether and, in some cases, when variable nodes have been toggled. Indications of determined conditions are stored in a syndrome memory 614 at check nodes, as described in relation to FIG. 2A.

Compare/toggle logic 608 is a device for determining whether to toggle the signal stored at a particular variable node, e.g., based on the processing rule of FIG. 3A. The compare/toggle logic 608 is communicatively coupled to the received signal state memory 604 so that the received signals can be used to determine whether or not to toggle a particular variable node. The compare/toggle logic 608 also can receive signals from the syndrome memory 614 and shifters 610 so that the syndromes indicated by the check nodes can be used to determine whether or not to toggle a particular variable node.

In particular, the compare/toggle logic 608 determines, for a particular variable node, whether, based on the check nodes for that variable node, that variable node should be toggled to a different value. If, based on check node processing rules, the compare/toggle logic 608 determines that the variable node should be toggled (as described above in relation to 364 of FIG. 3B), the compare/toggle logic 608 outputs a toggled value to the XOR logic 620.

If the compare/toggle logic 608 cannot determine whether the variable node should be toggled based on the check node processing rules, the compare/toggle logic 608 accesses the received signal of that variable node from the received signal state memory 604, as described above in relation to 364 and 366 of FIG. 3B. The compare/toggle logic 608 compares the received signal of the variable node to the current value of the variable node to determine whether the variable node has been toggled. The compare/toggle logic 608 determines whether to toggle the variable node and outputs a toggled value. Particular rules for determining when to toggle the variable node are described in relation to FIG. 6B. In other arrangements, the compare/toggle logic 608 may access prior toggling information from a toggle state memory, described above.

Convergence monitor 606 is a device for determining, based on the conditions stored in the check nodes of the syndrome memory 614, whether the decoder 600 has converged, as described in relation to 380 of FIG. 3B.

Figure 6B:
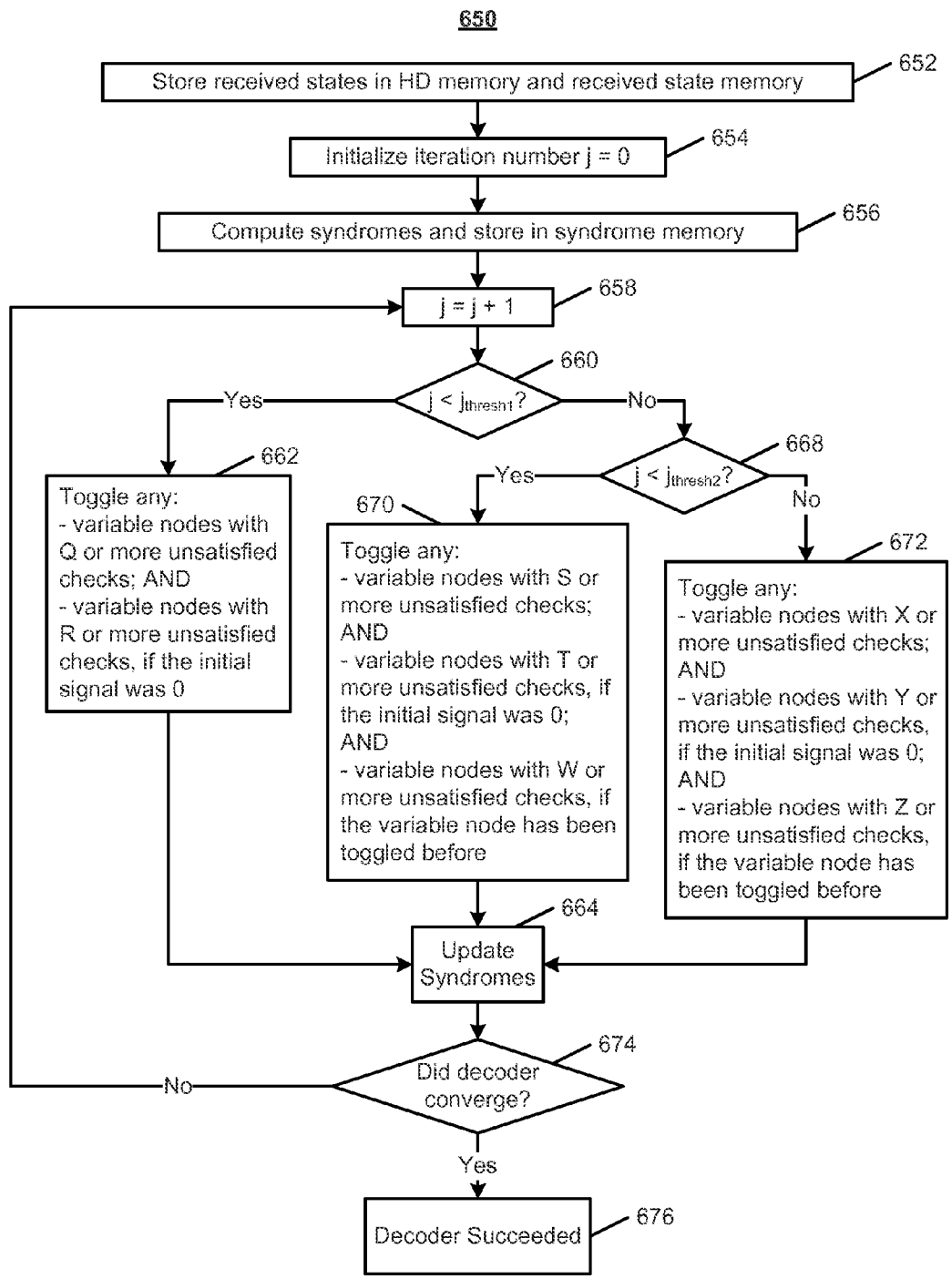
FIG. 6B shows a flow chart for a method of decoding a received codeword using the hardware of FIG. 6A, in accordance with some arrangements.

FIG. 6B shows a flow chart for a method 650 of decoding a codeword using the hardware of FIG. 6A. At 652, the received states of the detector sample 122 are stored in the HD memory 602 and in the received signal state memory 604. At 654, the iteration number j is initialized to 0; the iteration number j is incremented each time the decoder 600 iterates through all of the variable nodes in the HD memory 602. At 656, with j=0, the decoder 600 computes the syndromes based on the values of the variable nodes and stores the syndromes in check nodes in the syndrome memory 614. At 658, the decoder 600 increments j=j+1.

At 660, the decoder 600 compares j to a first threshold $j_{thres1}$ to determine whether to use the left-branch toggling rules (662) or to use the right-branch toggling rules (668-672). If the decoder 600 determines to use the right-branch toggling rules (668-672), the decoder then compares j to a second threshold $j_{thres2}$ to determine whether to use the toggling rules of 670 or the toggling rules of 672. In effect, the decoder 600 chooses between three sets of toggling rules 662, 670, and 672. The decoder 600 may apply these sets of toggling rules 662, 670, and 672 by iterating through the variable nodes in the HD memory 602 as described in relation to FIGS. 4B and 5B. In FIG. 6B, the choice of toggling rules is based on the iteration number j. In other embodiments, the choice of toggling rules can be based on other factors, such as the amount of error in the detector sample 122 (e.g., the number of erased variable nodes or the number of unsatisfied check nodes), or any combination of factors. In addition, while FIG. 6B shows three sets of toggling rules, 662, 670, and 672, in other arrangements, fewer sets or more sets of toggling rules may be used.

If $j<j_{thres1}$, at 662, the compare/toggle logic 608 applies a first set of toggling rules to each variable node in the HD memory 602. According to the exemplary first set of decoding rules shown at 662, any variable node with at least a threshold Q of corresponding unsatisfied checks received from the syndrome memory 614 should be toggled. In addition, any variable node with at least another threshold R of corresponding unsatisfied checks received from the syndrome memory 614 should be toggled if the initial signal for the variable node received from the received signal state memory 604 was 0 or erasure, as defined in FIG. 1C.

If $j≥j_{thres1}$ and $j<j_{thres2}$, at 670, the compare/toggle logic 608 applies a second set of toggling rules to each variable node in the HD memory 602. According to the exemplary second set of decoding rules shown at 670, any variable node with at least a threshold S of corresponding unsatisfied checks received from the syndrome memory 614 should be toggled. In addition, any variable node with at least another threshold T of corresponding unsatisfied checks received from the syndrome memory 614 should be toggled if the initial signal for the variable node received from the received signal state memory 604 was 0 or erasure, as defined in FIG. 1C. Further, any variable node with at least another threshold W of corresponding unsatisfied checks received from the syndrome memory 614 should be toggled if the variable node has been toggled before. The compare/toggle logic 608 can determine whether a variable node has been toggled before by comparing the signal from the received signal state memory 604 corresponding to the variable node to the current signal of the variable node stored in the HD memory 602. In other arrangements, the compare/toggle logic 608 receives prior toggling information from a toggle state memory, described above.

If $j≥j_{thres1}$ and $j≥j_{thres2}$, at 672, the compare/toggle logic 608 applies a third set of toggling rules to each variable node in the HD memory 602. According to the exemplary third set of decoding rules shown at 672, any variable node with at least a threshold X of corresponding unsatisfied checks received from the syndrome memory 614 should be toggled. In addition, any variable node with at least another threshold Y of corresponding unsatisfied checks received from the syndrome memory 614 should be toggled if the initial signal for the variable node received from the received signal state memory 604 was 0 or erasure, as defined in FIG. 1C. Further, any variable node with at least another threshold Z of corresponding unsatisfied checks received from the syndrome memory 614 should be toggled if the variable node has been toggled before. The compare/toggle logic 608 can determine whether a variable node has been toggled before by comparing the signal from the received signal state memory 604 corresponding to the variable node to the current signal of the variable node stored in the HD memory 602. In other arrangements, the compare/toggle logic 608 accesses prior toggling information from a toggle state memory, described above.

In some arrangements, the relationships between the thresholds described in relation to 662, 670, and 672 are as follows:

$$j_{thres1} \leq j_{thres2}$$

$$Q > R$$

$$S > T \geq W$$

$$X > Y \geq Z$$

$$Q \geq S \geq X$$

The above relations are not restricted; in other arrangements, alternative relationships between the thresholds can exist.

After all of the variable nodes in HD memory 602 have been processed according to the selected set of toggling rules 662, 670, or 672, at 664, the syndrome memory 614 is updated. In some arrangements, the syndrome memory 614 may be updated each time a variable node is toggled, as described in relation to FIGS. 4B and 5B. At 674, the convergence monitor 606 determines, based on the data stored in the syndrome memory 614, whether the decoder 600 has converged. If the decoder 600 has converged, at 676, the decoder 600 has succeeded. The decoder 600 then outputs the decoded message 128 to the receiving user or application 130. If the decoder 600 has not converged, at 658, the iteration number j is incremented, and j is compared to $j_{thres}$ at 660.

The above described arrangements and embodiments are presented for the purposes of illustration and not of limitation. One or more parts of techniques described above may be performed in a different order (or concurrently) and still achieve desirable results. In addition, the techniques of the disclosure may be implemented in hardware, such as on an application specific integrated circuit (ASIC) or on a field-programmable gate array (FPGA). The techniques of the disclosure may also be implemented in software, or in a combination of hardware and software.

What is claimed is:

1. A decoder comprising:
a syndrome memory;
a state memory; and
decoding circuitry communicatively coupled to the syndrome memory and the state memory, wherein the decoding circuitry is configured to:
retrieve data related to a symbol from the syndrome memory;
retrieve data related to the symbol from the state memory; and
process the data retrieved from the syndrome memory and the data retrieved from the state memory to determine whether to toggle a value of the symbol based at least in part on whether the symbol was previously toggled from an original state.

2. The decoder of claim 1, wherein:
the state memory is configured to store an indication of an original value of the symbol, the original value being a binary value; and
the decoding circuitry is further configured to determine whether to toggle the value of the symbol based on the original value of the symbol.

3. The decoder of claim 1, wherein:
the state memory is configured to store an indication of an original signal of the symbol; and
the decoding circuitry is further configured to determine whether to toggle the value of the symbol based on the original signal of the symbol.

4. The decoder of claim 1, wherein:
the state memory is configured to store an indication of whether the symbol has been previously toggled; and
the decoding circuitry is further configured to determine whether to toggle the value of the symbol based on whether the symbol has been previously toggled.

5. The decoder of claim 1, wherein:
the state memory is configured to store an indication of whether a value of a symbol has been toggled within a pre-specified number of preceding iterations; and
the decoding circuitry is further configured to determine whether to toggle the value of the symbol based on whether the symbol has been toggled within the pre-specified number of preceding iterations.

6. The decoder of claim 1, the decoder circuitry further configured to:
determine that the value of the symbol should be toggled; and
in response to determining that the value of the symbol should be toggled:
toggle the value of the symbol; and
update the state memory to indicate that the value of the symbol was toggled.

7. The decoder of claim 1, the decoding circuitry further configured to:
determine whether to retrieve data from the state memory based on the data retrieved from the syndrome memory; and
retrieve the data from the state memory in response to determining to retrieve data from the state memory.

8. The decoder of claim 7, wherein:
the syndrome memory comprises a plurality of check nodes related to the symbol; and
determining whether to retrieve data from the state memory comprises determining whether at least a number of the plurality of check nodes indicate that a check is unsatisfied.

9. The decoder of claim 7, wherein:
the syndrome memory comprises a plurality of check nodes related to the symbol; and
determining whether to retrieve data from the state memory comprises determining whether fewer than a number of the plurality of check nodes indicate that a check is unsatisfied.

10. The decoder of claim 1, wherein the decoding circuitry is configured to:
determine whether to toggle the value of the symbol during at least a first iteration and a second iteration;
determine whether to toggle the value of the symbol in the first iteration based on a first decision rule; and
determine whether to toggle the value of the symbol in the second iteration based on a second decision rule;
wherein the first decision rule is different from the second decision rule.

11. A method for decoding data, the method comprising:
retrieving data related to a symbol;

processing the retrieved data to determine whether to toggle a value of the symbol based at least in part on whether the symbol was previously toggled from an original state.

12. The method of claim 11, wherein:
the data related to the symbol comprises an indication of an original value of the symbol, the original value being a binary value; and
determining whether to toggle the value of the symbol is based on the original value of the symbol.

13. The method of claim 11, wherein:
the data related to a symbol comprises an indication of an original signal of a symbol; and
determining whether to toggle the value of the symbol is based on the original signal of the symbol.

14. The method of claim 11, wherein:
the data related to a symbol comprises an indication of whether a symbol has been toggled; and
determining whether to toggle the value of the symbol is based on whether the symbol has been previously toggled.

15. The method of claim 11, wherein the data related to a symbol comprises an indication of whether the value of the symbol has been toggled within a pre-specified number of preceding iterations; and
determining whether to toggle the value of the symbol is based on whether the symbol has been toggled within the pre-specified number of preceding iterations.

16. The method of claim 11 further comprising:
determining that the value of the symbol should be toggled; and
in response to determining that the value of the symbol should be toggled:
toggling the value of the symbol; and
updating the data related to the symbol to indicate that the value of the symbol was toggled.

17. The method of claim 11 further comprising:
determining whether to retrieve additional data related to previous toggling of the symbol; and
retrieving additional data related to the symbol in response to determining to retrieve additional data related to the symbol.

18. The method of claim 17 wherein determining whether to retrieve additional data related to previous toggling of the symbol comprises determining whether at least a number of a plurality of check nodes indicate that a check is unsatisfied.

19. The method of claim 17 wherein determining whether to retrieve additional data related to previous toggling of the symbol comprises determining whether fewer than a number of a plurality of check nodes indicate that a check is unsatisfied.

20. The method of claim 11 further comprising:
determining whether to toggle the value of the symbol during at least a first iteration and a second iteration;
determining whether to toggle the value of the symbol in the first iteration based on a first decision rule; and
determining whether to toggle the value of the symbol in the second iteration based on a second decision rule;
wherein the first decision rule is different from the second decision rule.

\* \* \* \* \*